(12) United States Patent
Lee (10) Patent No.: US 8,723,197 B2
(45) Date of Patent: May 13, 2014

(54) NITRIDE SEMICONDUCTOR LIGHT EMITTING DEVICE AND METHOD OF MANUFACTURING THE SAME

(75) Inventor: Suk Hun Lee, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 485 days.

(21) Appl. No.: 12/768,718

(22) Filed: Apr. 27, 2010

(65) Prior Publication Data

US 2010/0200877 A1    Aug. 12, 2010

Related U.S. Application Data

(63) Continuation of application No. 11/661,148, filed as application No. PCT/KR2005/002755 on Aug. 19, 2005, now Pat. No. 7,812,337.

(30) Foreign Application Priority Data

Aug. 26, 2004  (KR) .................. 10-2004-0067496

(51) Int. Cl.
H01L 33/32    (2010.01)

(52) U.S. Cl.
USPC ............................................. 257/94; 257/15

(58) Field of Classification Search
USPC .............. 257/26, 125, 164, 198, 514, 13, 257/79–103, 918, E51.018–E51.022, 257/E33.001–E33.077, E33.054, E25.028, 257/E25.032; 438/20, 342–346, 22–47, 69, 438/493, 503, 507, 956
See application file for complete search history.

(56) References Cited

U.S. PATENT DOCUMENTS

| | | | | |
|---|---|---|---|---|
| 5,990,500 | A * | 11/1999 | Okazaki | 257/99 |
| 6,115,399 | A * | 9/2000 | Shakuda | 372/45.01 |
| 6,172,382 | B1 * | 1/2001 | Nagahama et al. | 257/94 |
| 6,204,084 | B1 | 3/2001 | Sugiura et al. | |
| 6,849,881 | B1 | 2/2005 | Harle et al. | |
| 6,867,119 | B2 * | 3/2005 | He et al. | 438/585 |
| 7,015,139 | B2 * | 3/2006 | Yamashita | 438/674 |
| 2001/0035531 | A1 | 11/2001 | Kano et al. | |
| 2002/0153522 | A1 * | 10/2002 | Park et al. | 257/16 |
| 2004/0057481 | A1 * | 3/2004 | Lan et al. | 372/45 |
| 2004/0061119 | A1 * | 4/2004 | Inoue et al. | 257/79 |

(Continued)

FOREIGN PATENT DOCUMENTS

| | | |
|---|---|---|
| DE | 19955747 A1 | 5/2001 |
| DE | 19955747 A1 | 5/2001 |

(Continued)

OTHER PUBLICATIONS

"Pndium-Silicon co-doping of high-aluminum-content AlGaN for solar blind photodetectors" by Adivarahan et al. Applied Physics Letter vol. 79, No. 12, p. 1903. Sep. 2001.*

(Continued)

Primary Examiner — Marcos D. Pizarro
Assistant Examiner — Sue Tang
(74) Attorney, Agent, or Firm — Birch, Stewart, Kolasch & Birch, LLP (57) ABSTRACT

A semiconductor light emitting device including a first semiconductor layer, an active layer formed on the first semiconductor layer, a second semiconductor layer formed on the active layer, and at least one $SiN_x$ cluster layer formed between the first semiconductor layer and the second semiconductor layer.

14 Claims, 4 Drawing Sheets

(56) References Cited

U.S. PATENT DOCUMENTS

| | | |
|---|---|---|
| 2004/0101986 A1* | 5/2004 | Kozaki et al. .................. 438/22 |
| 2004/0159851 A1 | 8/2004 | Edmond et al. |
| 2004/0206961 A1* | 10/2004 | Yamada et al. ................ 257/79 |
| 2005/0139818 A1* | 6/2005 | Lee et al. ....................... 257/14 |
| 2005/0230688 A1 | 10/2005 | Lee |

FOREIGN PATENT DOCUMENTS

| | | |
|---|---|---|
| GB | 2 344 461 A | 6/2000 |
| JP | 10-12923 A | 1/1998 |
| JP | 2000-196143 A | 7/2000 |
| JP | 2000-349337 A | 12/2000 |
| JP | 2002-33513 A | 1/2002 |
| KR | 2002-0037111 A | 5/2002 |
| WO | WO-2004/017431 A1 | 2/2004 |
| WO | WO 2004/017431 A1 | 2/2004 |

OTHER PUBLICATIONS

Sakai, Shiro, et al. "Indium Silicon Co-doping in AlGaN/Gan Multiple Quantum Wells," Proceedings of International Workshop on Nitride Semiconductors, XP009133538, pp. 637-639, Jan. 1, 2000.

Chen et al., "Effect of Al content on the microstructure in GaN grown on Si by MOVPE," Physica Status Solidi, No. 7, 2003, pp. 2181-2184, ISSN: 1610-1634.

Hikosaka et al., "Al doping in (1-101) GaN films grown on patterned (001) Si substrate," Journal of Applied Physics, vol. 101, No. 10, May 21, 2007, pp. 103513-1-103513-5, XP012096869.

Lee et al., "Effect of Al doping in GaN films grown by metalorganic chemical vapor deposition," Applied Physics Letters, vol. 83, No. 5, Aug. 4, 2003, pp. 917-919, XP012035683.

* cited by examiner

NITRIDE SEMICONDUCTOR LIGHT EMITTING DEVICE AND METHOD OF MANUFACTURING THE SAME

This application is a Continuation of application Ser. No. 11/661,148, filed on Feb. 26, 2007, which is a National Stage of PCT International Application No. PCT/KR2005/002755, filed on Aug. 19, 2005, which designated the United States, and on which priority is claimed under 35 U.S.C. §120, the entire contents of which are hereby incorporated by reference.

TECHNICAL FIELD

The present invention relates to a nitride semiconductor light emitting device and a method of manufacturing the same.

BACKGROUND ART

In general, GaN based nitride semiconductor is applied to electronic devices that are high speed switching and high output devices such as blue and green light emitting diodes (LED), metal semiconductor field effect transistors (MESFET), and high electron mobility transistors (HEMT). In particular, the blue and green LEDs have already been produced and the global sales of the blue and green LEDs have exponentially increased.

The GaN based nitride semiconductor light emitting device is grown on a sapphire substrate or a SiC substrate. Then, an $Al_yGa_{1-y}N$ polycrystalline thin film is grown on the sapphire substrate or the SiC substrate as a buffer layer at a low growth temperature. Then, an undoped GaN layer, a Si-doped n-GaN layer, or a mixture of the above two structures is grown on the buffer layer at a high temperature to form an n-GaN layer as a first electrode layer. Also, an Mg-doped p-GaN layer is formed on the n-GaN layer as a second electrode layer to manufacture a nitride semiconductor light emitting device. An emission layer (a multiple quantum well structure activation layer) is interposed between the n-GaN layer and the p-GaN layer.

In general, in undoped GaN nitride semiconductor to which impurities are not added, yellow emission peak is shown over a very wide region in a 550 nm wavelength bandwidth, which is caused by the defects of vacancy of Ga atoms (VGa) in GaN nitride semiconductor crystal growth.

Among such defects, when the n-GaN nitride semiconductor that is the Si-doped first electrode layer is grown, VGa is reduced so that very strong bandedge emission is shown. When the GaN nitride semiconductor is doped with silicon, VGa is exchanged by silicon. However, the dangling bond of N atoms continuously exists to affect the reliability of the light emitting device.

Also, the p-GaN layer that is the second electrode layer is formed by doping Mg atoms during the growth of crystal. The position of Ga is exchanged by Mg atoms implanted as a doping source during the growth of crystal to form the p-GaN layer. The Mg atoms are combined with a hydrogen gas separated from a carrier gas and a source to form Mg—H compound in the GaN crystal layer so that a high resistance body of about 10MΩ is obtained.

Therefore, after forming a pn conjunction light emitting device, a subsequent activation process of cutting off the Mg—H compound to exchanging the Mg atoms into the position of Ga is required. However, the amount of the light emitting device that operates as a carrier that contributes to emission in the activation process is $10^{17}/cm^3$, which is much lower than Mg atomic concentration of no less than $10^{19}/cm^3$ so that it is very difficult to form resistant contact.

Also, the Mg atoms that remain in p-GaN nitride semiconductor without being activated to a carrier operate as a center that traps the light emitted from an interface to rapidly reduce optical output.

In order to solve the problem, very thin transmissive resistant metal is used to reduce contact resistance so that current implantation efficiency is improved. In general, the optical transmittance of the thin transmissive resistant metal used in order to reduce the contact resistance is about 75 to 80% and the other operates as loss. Also, it has limitations on improving the optical output of the light emitting device during the growth of the crystal of the nitride semiconductor without improving the design of the light emitting device and the crystal properties of the emission layer and the p-GaN layer in order to improve internal quantum efficiency.

DISCLOSURE

Technical Problem

It is an object of the present invention to provide a nitride semiconductor light emitting device capable of improving the crystal property of the activation layer that forms the nitride semiconductor light emitting device and of improving optical output and reliability and a method of manufacturing the same.

Technical Solution

In order to achieve the above object, there is provided a nitride semiconductor light emitting device comprising a first nitride semiconductor layer, an Al-doped first nitride semiconductor buffer layer formed on the first nitride semiconductor layer, an activation layer formed on the first nitride semiconductor buffer layer, and a second nitride semiconductor layer formed on the activation layer.

In order to achieve the above object, according to another embodiment, there is provided a nitride semiconductor light emitting device comprising a first nitride semiconductor layer, an activation layer formed on the first nitride semiconductor layer, an Al-doped second nitride semiconductor buffer layer formed on the activation layer, and a second nitride semiconductor layer formed on the second nitride semiconductor buffer layer.

Also, in order to achieve the above object, according to still another embodiment, there is provided a nitride semiconductor light emitting device comprising a first nitride semiconductor layer, an Al-doped first nitride semiconductor buffer layer formed on the first nitride semiconductor layer, an activation layer formed on the first nitride semiconductor buffer layer, an Al-doped second nitride semiconductor buffer layer formed on the activation layer, and a second nitride semiconductor layer formed on the second nitride semiconductor buffer layer.

Also, in order to achieve the above object, a method of manufacturing a nitride semiconductor light emitting device according to an embodiment of the present invention includes the steps of forming a buffer layer on a substrate, forming an In-doped GaN layer on the buffer layer, forming a first electrode layer on the In-doped GaN layer, forming a first Al-doped GaN buffer layer on the first electrode layer, forming an activation layer that emits light on the first Al-doped GaN buffer layer, forming a p-GaN layer on the activation layer, and forming a second electrode layer on the p-GaN layer.

A method of manufacturing a nitride semiconductor light emitting device according to another embodiment of the present invention includes the steps of forming a buffer layer on a substrate, forming an In-doped GaN layer on the buffer layer, forming a first electrode layer on the In-doped GaN layer, forming an activation layer that emits light on the first electrode layer, forming a second Al-doped GaN buffer layer on the activation layer, forming a p-GaN layer on the second Al-doped GaN buffer layer, and forming a second electrode layer on the p-GaN layer.

A method of manufacturing a nitride semiconductor light emitting device according to still another embodiment of the present invention includes the steps of forming a buffer layer on a substrate, forming an In-doped GaN layer on the buffer layer, forming a first electrode layer on the In-doped GaN layer, forming a first Al-doped GaN buffer layer on the first electrode layer, forming an activation layer that emits light on the first Al-doped GaN buffer layer, forming a second Al-doped GaN buffer layer on the activation layer, forming a p-GaN layer on the second Al-doped GaN buffer layer, and forming a second electrode layer on the p-GaN layer.

Advantageous Effects

According to the nitride semiconductor light emitting device of the present invention and the method of manufacturing the same, it is possible to improve the crystal property of the activation layer that forms the nitride semiconductor light emitting device and to improve the optical output and the reliability of the light emitting device.

BEST MODE FOR CARRYING OUT THE INVENTION

Preferred embodiments of the present invention will be described in detail with reference to the attached drawings.

Figure 1:
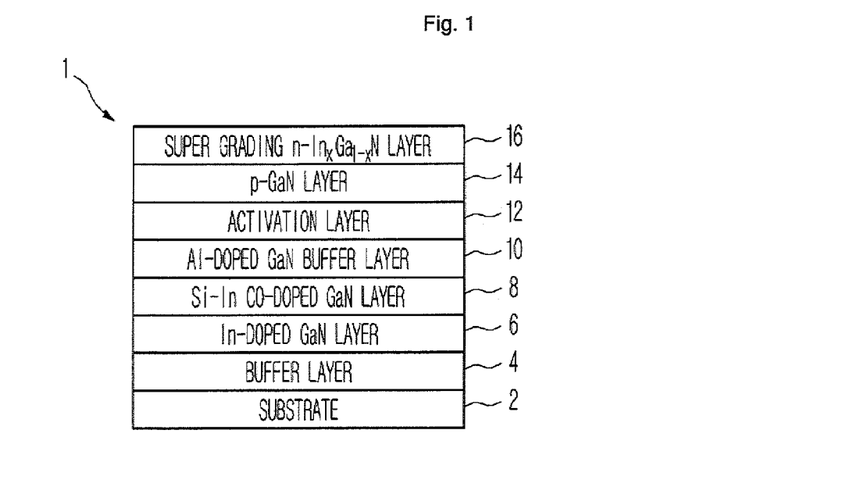
FIG. 1 schematically illustrates the stacked structure of a nitride semiconductor light emitting device according to a first embodiment of the present invention.

FIG. 1 schematically illustrates the stacked structure of a nitride semiconductor light emitting device according to a first embodiment of the present invention.

As illustrated in FIG. 1, in the nitride semiconductor light emitting device 1 according to the present invention, a buffer layer 4 is formed on a substrate 2. Here, the buffer layer 4 may have a structure selected from the group consisting of an AlInN/GaN stacked structure, an InGaN/GaN super lattice structure, an $In_xGa_{1-x}N/GaN$ stacked structure, and an $Al_xIn_yGa_{1-(x+y)}N/In_xGa_{1-x}N/GaN$ stacked structure ($0 \leq x \leq 1$, $0 \leq y \leq 1$, $x+y \leq 1$).

An In-doped GaN layer 6 is formed on the buffer layer 4 and an n-type first electrode layer is formed on the In-doped GaN layer 6. Here, Si—In co-doped GaN layer 8 may be used as the n-type first electrode layer.

Also, an Al-doped GaN buffer layer 10 is formed on the Si—In co-doped GaN layer 8 and an activation layer 12 that emits light is formed on the Al-doped GaN buffer layer 10. The activation layer 12 has a single quantum well structure or a multiple quantum well structure. An example of the stacked structure of the activation layer 12 will be described in detail with reference to FIG. 3. According to the activation layer 12 of the present invention, it is possible to obtain enough optical efficiency even when the activation layer 12 has the single quantum well structure.

According to the present invention, the Al-doped GaN buffer layer 10 may be formed by doping a small amount of GaAl atoms during the growth of the GaN nitride semiconductor after growing the Si—In co-doped GaN layer 8 used as the first electrode layer. The Al-doped GaN buffer layer 10 realizes a strong Al—N bond with N atoms that remain due to the dangling bond caused by the vacancy of Ga atoms to improve the state of an interface. Therefore, it is possible to minimize the crystal defect transited to the activation layer 12.

Then, a p-GaN layer 14 is formed on the activation layer 12. At this time, the p-GaN layer 14 may be doped with Mg. Also, the p-GaN layer 14 may be Mg—Al co-doped.

An n-type second electrode layer is formed on the p-GaN layer 14. Here, a super grading $n-In_x/Ga_{1-x}N$ layer 16 whose energy band gap is controlled by sequentially changing Indium composition may be used as the n-type second electrode layer. At this time, the composition range of the super grading $n-In_x/ga_{1-x}N$ layer 16 may be $0<x<0.2$. The super grading $n-In_x/Ga_{1-x}N$ layer 16 may be doped with silicon.

As described above, the nitride semiconductor light emitting device according to the present invention has an npn junction light emitting device structure unlike the conventional pn junction light emitting device considering that the first electrode layer 8 and the second electrode layer 16 are formed of the n-type nitride semiconductor and the p-GaN layer 14 is interposed between the first electrode layer 8 and the second electrode layer 16.

Also, since the resistance of the n-type nitride semiconductor (for example, the super grading $n-In_x/Ga_{1-x}N$ layer 16) used as the second electrode layer is lower than the resistance of the conventional p-GaN contact layer, it is possible to reduce contact resistance to maximize the implantation of current. A transmissive resistant or transmissive oxide layer capable of maximizing current diffusion and having excellent optical transmittance may be used as a transparent electrode that applies a bias voltage to the second electrode in order to maximize optical output. ITO, ZnO, RuOx, IrOx, NiO, or Au alloy metal including Ni may be used as such a material.

Here, although not shown, an InGaN/AlInGaN super lattice structure layer or an InGaN/InGaN super lattice structure layer may be used as the second electrode layer. The InGaN/AlInGaN super lattice structure layer or the InGaN/InGaN super lattice structure layer may be doped with silicon.

On the other hand, the following specimen was manufactured and the characteristics thereof were examined in order to testify the electrical/optical characteristics and effect of the Al-doped GaN nitride semiconductor.

According to the present invention, a specimen having a two dimensional electron gas (2DEG) structure composed of an AlGaN/undoped GaN/SI (semi-insulating) GaN/buffer/sapphire substrate and an AlGaN/Al-doped GaN/SI (semi-insulating) GaN/buffer/sapphire substrate was manufactured and the electrical/optical characteristics of the specimen were measured.

First, in the electrical characteristic examined by Hall measurement, the carrier mobility of the structure to which an undoped GaN layer is applied was 1,130 and 3,390 cm²/Vsec at a room temperature and at a low temperature of 77K. The carrier mobility of the structure to which an Al-doped GaN layer is applied was 1,500 and 4,870 cm²/Vsec at the room temperature and at the low temperature of 77K. Therefore, it is noted that the structure to which the Al-doped GaN layer is applied has excellent characteristic. At this time, the sheet concentration was 1 to $1.2e^{13}$/cm² at the room temperature and at the low temperature of 77K.

The reason why the carrier mobility increases without increase in the sheet concentration is because the vacancy of the Ga atoms of the undoped GaN nitride semiconductor is exchanged by Al atoms so that the Al atoms are combined with the N atoms that remain due to the dangling bond to form an Al—N bond that is stronger than a Ga—N bond and to thus reduce crystal defects.

Also, in 10K PL measurement for testifying the optical characteristic, stronger bandedge emission stronger by no less than 7 times was observed in the structure to which the Al-doped GaN layer is applied than in the structure to which undoped GaN layer is applied.

Such a result coincides with the result of testifying the electrical characteristic so that the excellent electrical/optical characteristics of the Al-doped GaN buffer nitride semiconductor are testified. The crystal defect or point defect generated by the first electrode layer to be transited to the emission layer is effectively suppressed to maximize the quantum efficiency of the light emitting device.

Figure 2:
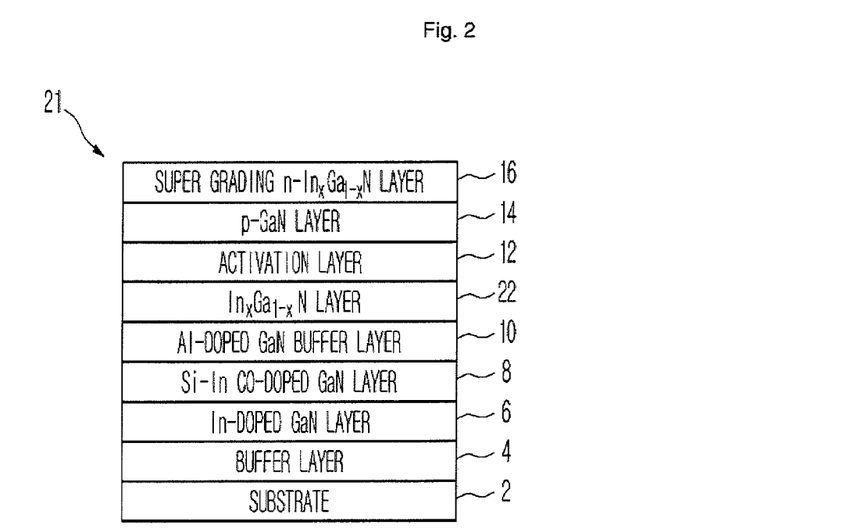
FIG. 2 schematically illustrates the stacked structure of a nitride semiconductor light emitting device according to a second embodiment of the present invention.

On the other hand, FIG. 2 schematically illustrates the stacked structure of a nitride semiconductor light emitting device according to a second embodiment of the present invention. In the stacked structure illustrated in FIG. 2, description of the layer (denoted by the same reference numeral) described with reference to FIG. 1 will be omitted.

A nitride semiconductor light emitting device 21 according to the second embodiment of the present invention is different from the nitride semiconductor light emitting device 1 according to the first embodiment illustrated in FIG. 1 in that an $In_xGa_{1-x}N$ layer 22 containing a small amount of Indium is further included.

That is, according to the nitride semiconductor light emitting device 21 according to the second embodiment of the present invention, the $In_xGa_{1-x}N$ layer 22 containing a small amount of Indium is further formed between the Al-doped GaN buffer layer 10 and the activation layer 12. In order to improve internal quantum efficiency, the $In_xGa_{1-x}N$ layer 22 containing a small amount of Indium is additionally grown before growing the activation layer 12 to control the strain of the activation layer 12.

Figure 3:
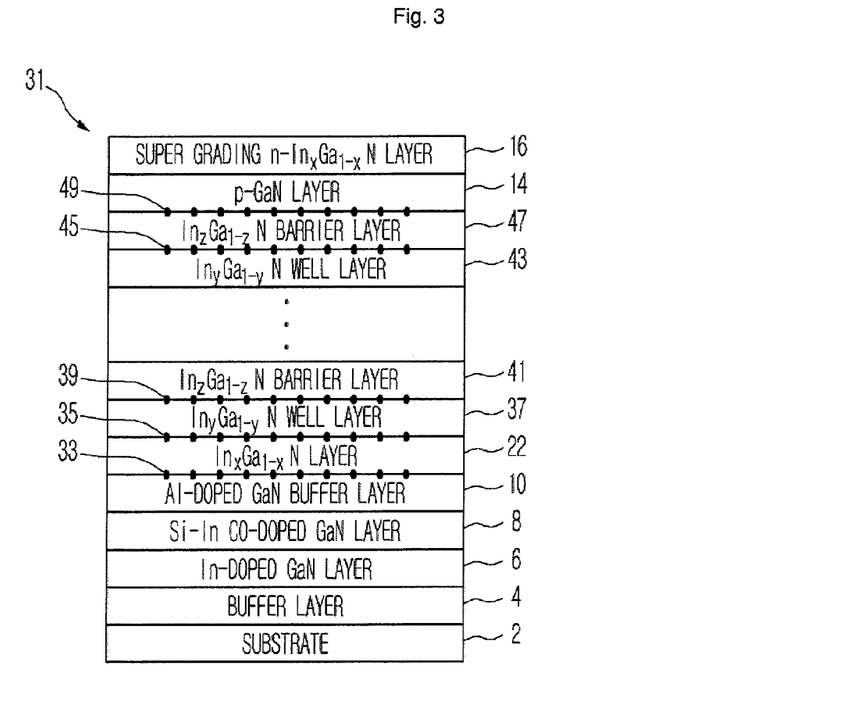
FIG. 3 schematically illustrates the stacked structure of a nitride semiconductor light emitting device according to a third embodiment of the present invention.

Then, the structure of the activation layer applied to a nitride semiconductor light emitting device 31 according to the present invention will be described in detail with reference to FIG. 3. FIG. 3 schematically illustrates the stacked structure of a nitride semiconductor light emitting device according to a third embodiment of the present invention. In the stacked structure illustrated in FIG. 3, description of the layer (denoted by the same reference numeral) described with reference to FIG. 1 will be omitted.

In a nitride semiconductor light emitting device 31 according to the third embodiment of the present invention, as illustrated in FIG. 3, in order to increase the internal quantum efficiency, the low-mole layer 22 containing a small amount of Indium that controls the strain of the activation layer is formed. Also, in order to improve optical output and reverse leakage current caused by fluctuation in Indium, $SiN_x$ cluster layers 33 and 35 controlled in the form of an atomic scale are further formed under and on the low-mole $In_xGa_{1-x}N$ layer 22.

Also, the activation layer that emits light may has a single quantum well structure or a multiple quantum well structure formed of $In_yGa_{1-y}N$ well layers/$In_zGa_{1-z}N$ barrier layers.

In FIG. 3, a light emitting device in which the activation layer has the multiple quantum well structure that further comprises $SiN_x$ cluster layers 39 and 45 between $In_yGa_{1-y}N$ well layers 37 and 43 and $In_zGa_{1-z}N$ barrier layers 41 and 47 is illustrated. Here, in order to improve the emission efficiency of the activation layer, the composition ratio may be controlled to be the $In_yGa_{1-y}N$ well layers (0<y<0.35) the $SiN_x$ cluster layers/the $In_zGa_{1-z}N$ barrier layers (0<z<0.1). Considering the relationship between the activation layer and the low-mole $In_xGa_{1-x}N$ layer 22 containing a small amount of Indium, the amount of Indium with which the $In_yGa_{1-y}N$ well layers 37 and 43/the $In_zGa_{1-z}N$ barrier layers 41 and 47 are doped and the amount of Indium with which the low-mole $In_xGa_{1-x}N$ layer 22 is doped may be controlled to have the values of 0<x<0.1, 0<y<0.35, and 0<z<0.1.

Also, although not shown in the drawings, a GaN cap layer for controlling fluctuation in the amount of Indium of the $In_yGa_{1-y}N$ well layers may be formed between the $In_yGa_{1-y}N$ well layers and the $In_zGa_{1-z}N$ barrier layers that form the activation layer. At this time, the amounts of Indium of the well layers and the barrier layers that emit light may be formed to be $In_yGa_{1-y}N$ (0<y<0.35)/GaN cap/$In_zGa_{1-z}N$ (0<z<0.1).

After growing the last layer of the activation layer having the single quantum well structure or the multiple quantum well structure, the $SiN_x$ cluster layer 49 is grown to the thickness of the atomic scale so that it is possible to prevent the Mg atoms of the p-GaN layer 14 from diffusing into the inside of the activation layer.

Figure 4:
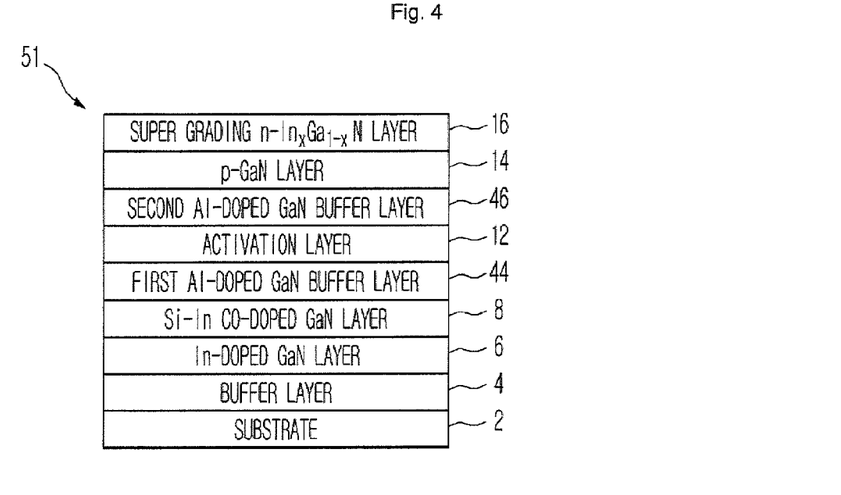
FIG. 4 schematically illustrates the stacked structure of a nitride semiconductor light emitting device according to a fourth embodiment of the present invention.

On the other hand, FIG. 4 schematically illustrates the stacked structure of a nitride semiconductor light emitting device according to a fourth embodiment of the present invention. In the stacked structure illustrated in FIG. 4, description of the layer (denoted by the same reference numeral) described with reference to FIG. 1 will be omitted.

A nitride semiconductor light emitting device 51 according to the fourth embodiment of the present invention is different from the nitride semiconductor light emitting device 1 according to the first embodiment illustrated in FIG. 1 in that a first Al-doped GaN buffer layer 44 is formed under the activation layer 12 and that a second Al-doped GaN buffer layer 46 is formed on the activation layer 12.

According to the fourth embodiment of the present invention, the first Al-doped GaN buffer layer 44 may be formed by doping a small amount of GaAl atoms during the growth of the GaN nitride semiconductor after growing the Si—In co-doped GaN layer 8 used as the first electrode layer. The first Al-doped GaN buffer layer 44 realizes a strong Al—N bond with the N atoms that remain due to the dangling bond caused by the vacancy of the Ga atoms to improve the state of an interface. Therefore, it is possible to minimize the crystal defect transited to the activation layer 12.

Also, before growing the p-GaN layer 14, the second Al-doped GaN buffer layer 46 is grown again between the activation layer 12 and the p-GaN layer 14 so that it is possible to fill the vacancy of the Ga atoms and to prevent the Mg atoms from being diffused into the inside of the activation layer 12 during the growth of the p-GaN layer 14. Therefore, it is possible to improve the interface characteristic and to improve the internal quantum efficiency of the activation layer 12 to maximize the optical output of the light emitting device.

Figure 5:
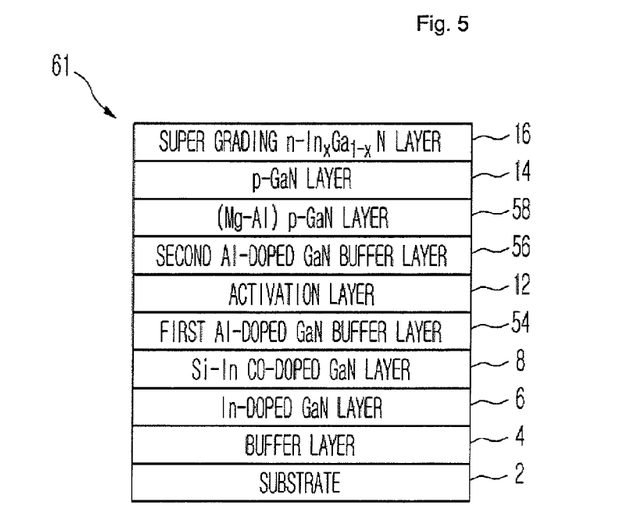
FIG. 5 schematically illustrates the stacked structure of a nitride semiconductor light emitting device according to a fifth embodiment of the present invention.

FIG. 5 schematically illustrates the stacked structure of a nitride semiconductor light emitting device according to a fifth embodiment of the present invention. In the stacked structure illustrated in FIG. 5, description of the layer (denoted by the same reference numeral) described with reference to FIG. 1 will be omitted.

A nitride semiconductor light emitting device 61 according to the fifth embodiment of the present invention is different from the nitride semiconductor light emitting device 1 according to the first embodiment illustrated in FIG. 1 in that a first Al-doped GaN buffer layer 54 is formed under the activation layer 12, that a second Al-doped GaN buffer layer 56 is formed on the activation layer 12, and that an (Mg—Al) p-GaN layer 58 is further formed between the second Al-doped GaN buffer layer 56 and the p-GaN layer 14. The nitride semiconductor light emitting device 61 is formed to have such a stacked structure so that it is possible to improve the interface characteristic of the activation layer 12 and to increase the optical output.

Figure 6:
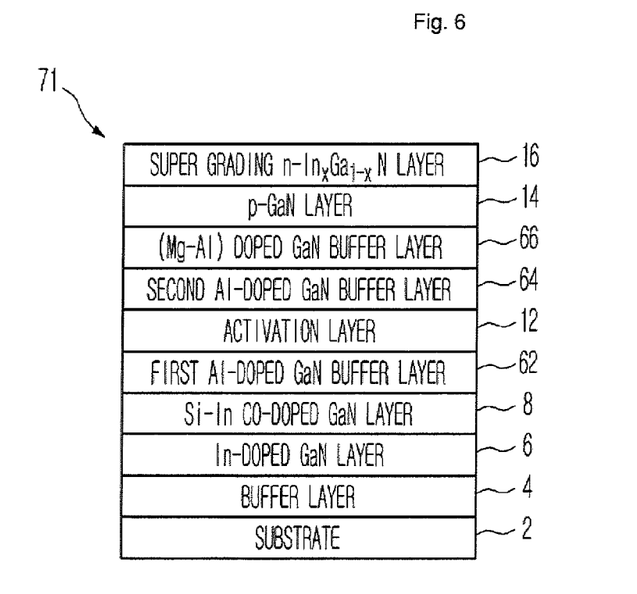
FIG. 6 schematically illustrates the stacked structure of a nitride semiconductor light emitting device according to a sixth embodiment of the present invention.

FIG. 6 schematically illustrates the stacked structure of a nitride semiconductor light emitting device according to a sixth embodiment of the present invention. In the stacked structure illustrated in FIG. 6, description of the layer (denoted by the same reference numeral) described with reference to FIG. 1 will be omitted.

A nitride semiconductor light emitting device 71 according to the sixth embodiment of the present invention is different from the nitride semiconductor light emitting device 1 according to the first embodiment illustrated in FIG. 1 in that a first Al-doped GaN buffer layer 62 is formed under the activation layer 12, that a second Al-doped GaN buffer layer 64 is formed under the activation layer 12, and that an (Mg—Al) doped GaN buffer layer 66 is further formed between the second Al-doped GaN buffer layer 64 and the p-GaN layer 14. The nitride semiconductor light emitting device 71 having such a stacked structure is formed so that it is possible to improve the interface characteristic of the activation layer 12 and to increase the optical output.

Figure 7:
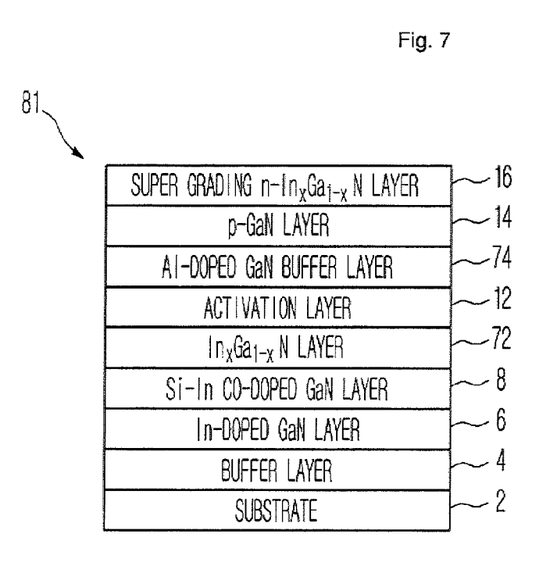
FIG. 7 schematically illustrates the stacked structure of a nitride semiconductor light emitting device according to a seventh embodiment of the present invention.

FIG. 7 schematically illustrates the stacked structure of a nitride semiconductor light emitting device according to a seventh embodiment of the present invention. In the stacked structure illustrated in FIG. 7, description of the layer (denoted by the same reference numeral) described with reference to FIG. 1 will be omitted.

A nitride semiconductor light emitting device 81 according to the seventh embodiment of the present invention is different from the nitride semiconductor light emitting device 1 according to the first embodiment illustrated in FIG. 1 in that an $In_xGa_{1-x}N$ layer 72 containing a small amount of Indium is formed under the activation layer 12 and that an Al-doped GaN buffer layer 74 is formed on the activation layer 12.

That is, in the nitride semiconductor light emitting device 81 according to the seventh embodiment of the present invention, the $In_xGa_{1-x}N$ layer 72 containing a small amount of Indium is further formed between the Si—In co-doped GaN layer 8 that is the first electrode layer and the activation layer 12. In order to increase the internal quantum efficiency, before growing the activation layer 12, the $In_xGa_{1-x}N$ layer 72 containing a small amount of Indium is further grown to control the strain of the activation layer 12.

Also, before growing the p-GaN layer 14, the Al-doped GaN buffer layer 74 is grown between the activation layer 12 and the p-GaN layer 14 so that it is possible to prevent the Mg atoms from being diffused into the inside of the activation layer 12 during the growth of the p-GaN layer 14. Therefore, it is possible to improve the interface characteristic and the internal quantum efficiency of the activation layer 12 and to thus maximize the optical output of the light emitting device.

INDUSTRIAL APPLICABILITY

According to the nitride semiconductor light emitting device of the present invention and the method of manufacturing the same, it is possible to improve the crystal property of the activation layer that forms the nitride semiconductor light emitting device and to improve the optical output and the reliability of the light emitting device.

The invention claimed is:

1. A semiconductor light emitting device, comprising:
   a first semiconductor layer;
   an active layer comprising at least one well layer and at least one barrier layer on the first semiconductor layer;
   a second semiconductor layer formed on the active layer; and
   at least one $SiN_x$ cluster layer formed between the at least one well layer and the at least one barrier layer, wherein the at least one well layer, the at least one barrier layer, and the at least one $SiN_x$ cluster layer are substantially parallel to a top surface of the first semiconductor layer.

2. The semiconductor light emitting device as claimed in claim 1, further comprising:
   at least one nitride based semiconductor layer selected from a first nitride based semiconductor layer including Al, which is formed between
   the first semiconductor layer and the active layer, and a second nitride based semiconductor layer including Al, which is formed
   between the active layer and the second semiconductor layer.

3. The semiconductor light emitting device as claimed in claim 2, further comprising:
   at least one $SiN_x$ cluster layer formed between the first nitride based semiconductor layer including Al and the active layer.

4. The semiconductor light emitting device as claimed in claim 1, further comprising:
   a third semiconductor layer formed on the second semiconductor layer, wherein the second semiconductor layer includes a GaN layer containing Mg and Al, and wherein the third semiconductor layer has one of
   a) a super grading structure in which an amount of Indium sequentially changes,
   b) a super lattice structure in which In or Al is contained,
   c) a n-InxGa1 -xN layer ($0<x<0.2$) super grading structure,
   d) an InGaN/InGaN super lattice structure,
   e) an InGaN/AlInGaN super lattice structure, or
   f) is doped with silicon.

5. The semiconductor light emitting device as claimed in claim 1, further comprising:
   an $In_xGa_{1-x}N$ layer formed between the first semiconductor layer and the active layer.

6. The semiconductor light emitting device as claimed in claim 1, further comprising:
a transparent electrode at a top surface of the light emitting device.

7. The semiconductor light emitting device as claimed in claim 6, wherein the transparent electrode is formed of transmissive oxide or transmissive resistant material.

8. The semiconductor light emitting device as claimed in claim 6, wherein the transparent electrode is formed of one selected among the group consisting of ITO, ZnO, $IrO_x$, $RuO_x$, NiO, and Au alloy including Ni.

9. The semiconductor light emitting device as claimed in claim 1, wherein the first semiconductor layer comprises:
an InGaN layer; and
an electrode contact layer.

10. The semiconductor light emitting device as claimed in claim 1, wherein the at least one $SiN_x$ cluster layer has a thickness of atomic scale.

11. A semiconductor light emitting device, comprising:
a first semiconductor layer;
an active layer formed on the first semiconductor layer;
a second semiconductor layer formed on the active layer;
a first $SiN_x$ cluster layer formed between the active layer and the second semiconductor layer:
at least one nitride based semiconductor layer selected from:
a first nitride based semiconductor layer having Al, which is formed between the first semiconductor layer and the active layer, and
a second nitride based semiconductor layer having Al, which is formed between the active layer and the second semiconductor layer; and
a second $SiN_x$ cluster layer formed between the active layer and the first semiconductor layer,
wherein the first semiconductor layer includes an InGaN layer.

12. The semiconductor light emitting device as claimed in claim 11, further comprising:
a GaN layer under the InGaN layer.

13. The semiconductor light emitting device as claimed in claim 11, further comprising:
an $In_xGa_{1-x}N$ layer between the first nitride based semiconductor layer having Al and the active layer in order to control a strain of the active layer.

14. The semiconductor light emitting device as claimed in claim 11, wherein the first $SiN_x$ cluster layer has a thickness of atomic scale.

* * * * *